US009634625B2

(12) United States Patent
Lu et al.

(10) Patent No.: US 9,634,625 B2
(45) Date of Patent: Apr. 25, 2017

(54) RADIO FREQUENCY TRANSMITTER WITH EXTENDED POWER RANGE AND RELATED RADIO FREQUENCY TRANSMISSION METHOD

(71) Applicant: MEDIATEK INC., Hsin-Chu (TW)

(72) Inventors: Chao Lu, Fremont, CA (US);
Chun-Hsien Peng, Nantou County (TW); Paul Cheng Po Liang, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/252,795

(22) Filed: Apr. 15, 2014

(65) Prior Publication Data

US 2014/0355717 A1 Dec. 4, 2014

Related U.S. Application Data

(60) Provisional application No. 61/828,031, filed on May 28, 2013.

(51) Int. Cl.
| | | |
|---|---|---|
| *H03F 3/24* | (2006.01) | |
| *H03F 3/21* | (2006.01) | |
| *H03F 3/45* | (2006.01) | |
| *H03F 1/02* | (2006.01) | |
| *G11C 7/22* | (2006.01) | |

(52) U.S. Cl.
CPC ............... *H03F 3/245* (2013.01); *G11C 7/22* (2013.01); *H03F 1/0211* (2013.01); *H03F 1/0266* (2013.01); *H03F 3/211* (2013.01); *H03F 3/45179* (2013.01); *H03F 2200/321* (2013.01); *H03F 2200/336* (2013.01); *H03F 2203/45302* (2013.01)

(58) Field of Classification Search
CPC .... H03F 1/0211; H03F 3/68; H03F 2200/447; H03F 1/0277; H03F 3/24; H03F 2200/321; H03F 3/45076
USPC .......................................... 375/260; 365/226
See application file for complete search history.

(56) References Cited

U.S. PATENT DOCUMENTS

| | | | | |
|---|---|---|---|---|
| 4,361,901 A | * | 11/1982 | Daniels .................... | A61B 6/02 257/10 |
| 4,553,047 A | * | 11/1985 | Dillinger ................. | G05F 3/205 327/537 |
| 5,115,203 A | | 5/1992 | Krett | |
| 5,351,107 A | * | 9/1994 | Nakane .............. | G03G 15/5041 347/131 |

(Continued)

FOREIGN PATENT DOCUMENTS

| | | |
|---|---|---|
| CN | 1636316 A | 7/2005 |
| CN | 101072040 A | 11/2007 |
| CN | 101414852 A | 4/2009 |

*Primary Examiner* — Young T Tse
*Assistant Examiner* — Sarah Hassan
(74) *Attorney, Agent, or Firm* — Winston Hsu; Scott Margo

(57) ABSTRACT

A radio frequency transmitter includes a digital power amplifier and a bias control circuit. The digital power amplifier is arranged for receiving at least a radio frequency input signal, a digital amplitude control word signal and at least one bias voltage to generate a radio frequency output signal. The bias control circuit is coupled to the digital power amplifier, and is arranged for adjusting the at least one bias voltage according to a power control signal.

24 Claims, 9 Drawing Sheets

(56) References Cited

U.S. PATENT DOCUMENTS

| | | | |
|---|---|---|---|
| 6,031,780 A * | 2/2000 | Abe | G11C 7/22 |
| | | | 365/226 |
| 6,201,440 B1 * | 3/2001 | Kobayashi | 330/51 |
| 6,737,917 B2 | 5/2004 | Ryoo | |
| 7,023,278 B1 * | 4/2006 | Vagher et al. | 330/284 |
| 8,014,539 B2 | 9/2011 | Song | |
| 8,184,830 B1 | 5/2012 | Persson | |
| 8,213,888 B2 * | 7/2012 | Kuriyama | H03G 3/02 |
| | | | 330/278 |
| 2001/0019287 A1 * | 9/2001 | Nishimura | G05F 3/205 |
| | | | 327/543 |
| 2002/0001116 A1 * | 1/2002 | Kajiya | G02F 1/0123 |
| | | | 398/197 |
| 2003/0001662 A1 * | 1/2003 | Callahan, Jr. | G05F 3/205 |
| | | | 327/541 |
| 2003/0155978 A1 | 8/2003 | Pehlke | |
| 2004/0251962 A1 * | 12/2004 | Rosnell | H03F 3/2176 |
| | | | 330/134 |
| 2005/0069337 A1 * | 3/2005 | Suzumi | G03G 15/5004 |
| | | | 399/88 |
| 2008/0069286 A1 * | 3/2008 | Staszewski | G06F 1/04 |
| | | | 375/376 |
| 2011/0129037 A1 * | 6/2011 | Staszewski et al. | 375/316 |
| 2013/0094607 A1 | 4/2013 | Lai | |
| 2013/0094611 A1 * | 4/2013 | Lai | H03F 3/2176 |
| | | | 375/297 |

* cited by examiner

RADIO FREQUENCY TRANSMITTER WITH EXTENDED POWER RANGE AND RELATED RADIO FREQUENCY TRANSMISSION METHOD

CROSS REFERENCE TO RELATED APPLICATIONS

This application claims the benefit of U.S. provisional application No. 61/828,031, filed on May 28, 2013, the contents of which are incorporated herein by reference.

BACKGROUND

The disclosed embodiments of the present invention relate to radio frequency transmission, and more particularly, to a radio frequency transmitter with an extended power range, and a related radio frequency transmission method.

As digital radio design may offer many benefits, such as reduced circuit size and prolonged battery life, it is desired to convert analog intensive designs into digitally intensive designs. For example, a radio frequency (RF) transmitter may employ a digital power amplifier (DPA) to enhance power efficiency, wherein the DPA may include a plurality of power cells controlled by an amplitude control word (ACW) signal, and an output power of the DPA may be controlled in a digital manner.

However, digital power control of the DPA limits a dynamic power range thereof. In high power application, a saturation power may limit an output power of the DPA; in low power application, quantization errors may occur. Additionally, power efficiency of the DPA is decreased due to a digital power back-off. The digital power back-off also limits the dynamic power range. Further, the saturation power of the DPA is varied in response to process variations, thus degrading performance of the DPA.

Thus, there is a need for a novel power amplifier to extend the dynamic transmission power range, enhance the power efficiency and reduce sensitivity to process variations.

SUMMARY

In accordance with exemplary embodiments of the present invention, a radio frequency transmitter with an extended power range and a related radio frequency transmission method are proposed to solve the above-mentioned problems.

According to an embodiment of the present invention, an exemplary radio frequency (RF) transmitter is disclosed. The exemplary RF transmitter comprises a digital power amplifier (DPA) and a bias control circuit. The DPA is arranged for receiving at least an RF input signal, a digital amplitude control word signal and at least one bias voltage to generate an RF output signal. The bias control circuit is coupled to the DPA, and is arranged for adjusting the at least one bias voltage according to a power control signal.

According to an embodiment of the present invention, an exemplary frequency (RF) transmission method is disclosed. The exemplary RF transmission method comprises the following steps: adjusting at least one bias voltage according to a power control signal; and utilizing a DPA to generate an RF output signal according to at least an RF input signal, a digital amplitude control word signal and the at least one bias voltage.

The proposed gate bias control mechanism may enhance dynamic output power range, power efficiency and system performance of an RF transmitter. Additionally, the gate bias control mechanism may be employed in saturation power tuning, thereby reducing/eliminating effects of process variations on transmission performance.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "coupled" is intended to mean either an indirect or direct electrical connection. Accordingly, if one device is electrically connected to another device, that connection may be through a direct electrical connection, or through an indirect electrical connection via other devices and connections.

In order to extend a dynamic transmission power range, the proposed RF transmitter may control/adjust an output power (or a power control range) of a digital power amplifier (DPA) by controlling a bias voltage (e.g. a gate voltage of a metal-oxide-semiconductor (MOS) transistor) of the DPA, a duty cycle of an RF input signal of the DPA, and/or a supply voltage supplied to the DPA. Additionally, a saturation power of DPA may be tuned (or calibrated) by controlling the bias voltage thereof, thus reducing/eliminating effects of process variations on transmission performance.

Figure 1:
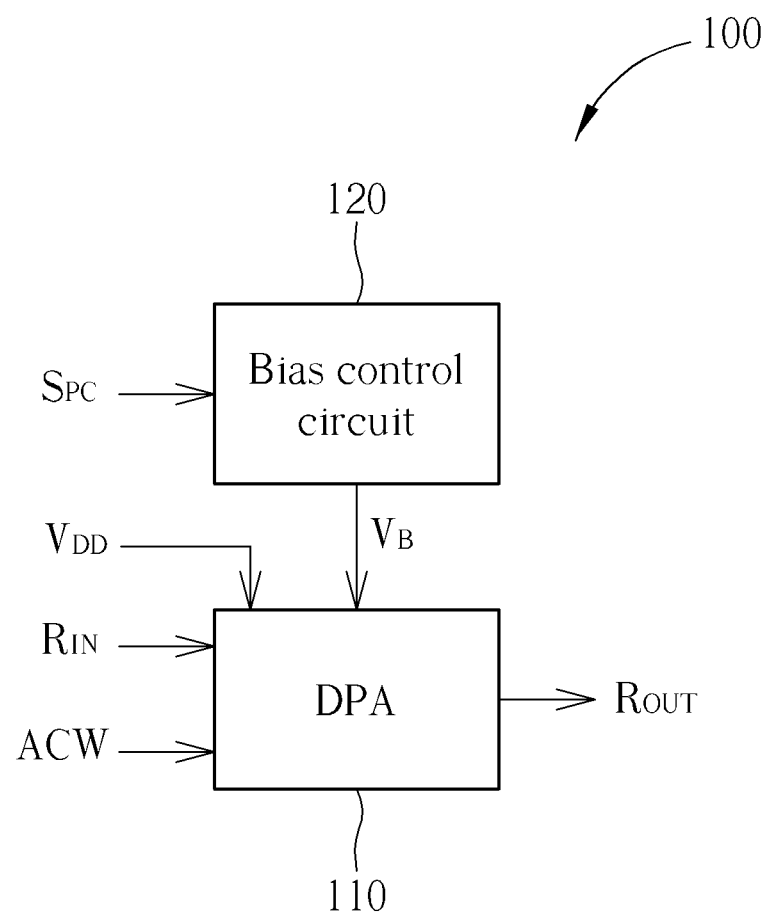
FIG. 1 is a block diagram illustrating an exemplary radio frequency transmitter according to an embodiment of the present invention.

Please refer to FIG. 1, which is a block diagram illustrating an exemplary RF transmitter according to an embodiment of the present invention. In this embodiment, the RF transmitter 100 may include, but is not limited to, a DPA 100 and a bias control circuit 120. The bias control circuit 120 is coupled to the DPA 110, and is arranged for providing a bias voltage $V_B$ for the DPA 110 according to a power control signal $S_{PC}$. The DPA 110 is arranged for receiving an RF input signal $R_{IN}$ (generated from a signal generation circuit; not shown in FIG. 1), a digital amplitude control word signal ACW and the bias voltage $V_B$ to generate an RF output signal $R_{OUT}$. The bias control circuit 120 may further adjust the bias voltage $V_B$ according to power control signal $S_{PC}$, wherein an output power (or a power control range) of the DPA 110 may be adjusted according to a voltage level of the bias voltage $V_B$. By way of example, but not limitation, the power control signal $S_{PC}$ may be a command signal.

Please note that the bias voltage $V_B$ generated by the bias control circuit 120 may be supplied to a voltage node of the DPA 110, wherein a voltage variation of the voltage node may not impact (or narrow) a dynamic power range of the DPA 100. To put it differently, adjustment of the bias voltage $V_B$ may extend the power control range of the DPA 110 without impacting the dynamic power range of the DPA 100. By way of example, but not limitation, the bias voltage $V_B$ generated by the bias control circuit 120 may be supplied to a gate of at least one MOS transistor included in the DPA 110 (not shown in FIG. 1). Hence, by controlling/adjusting the bias voltage $V_B$ (i.e. a gate voltage), the bias control circuit 120 may adjust a current component of the RF output signal $R_{OUT}$ (e.g. a drain-to-source current or a source-to-drain current of the at least one MOS transistor) to thereby adjust an output power of the RF output signal $R_{OUT}$. Additionally, the output power of the RF output signal $R_{OUT}$ may be adjusted according to a duty cycle of the RF input signal $R_{IN}$. When the duty cycle of the RF input signal $R_{IN}$ is adjusted according to the power control signal $S_{PC}$, the power control range may be further extended. A supply voltage of the DPA 110 (generated from a power supply circuit; not shown in FIG. 1) may also be adjusted according to the power control signal $S_{PC}$ so that a direct current (DC) component of the RF output signal $R_{OUT}$ may be adjusted accordingly. Further, the DPA 110 may refer to the digital amplitude control word signal ACW to adjust the output power of the RF output signal $R_{OUT}$. In other words, the RF transmitter 100 may have a wide dynamic power range.

Figure 2:
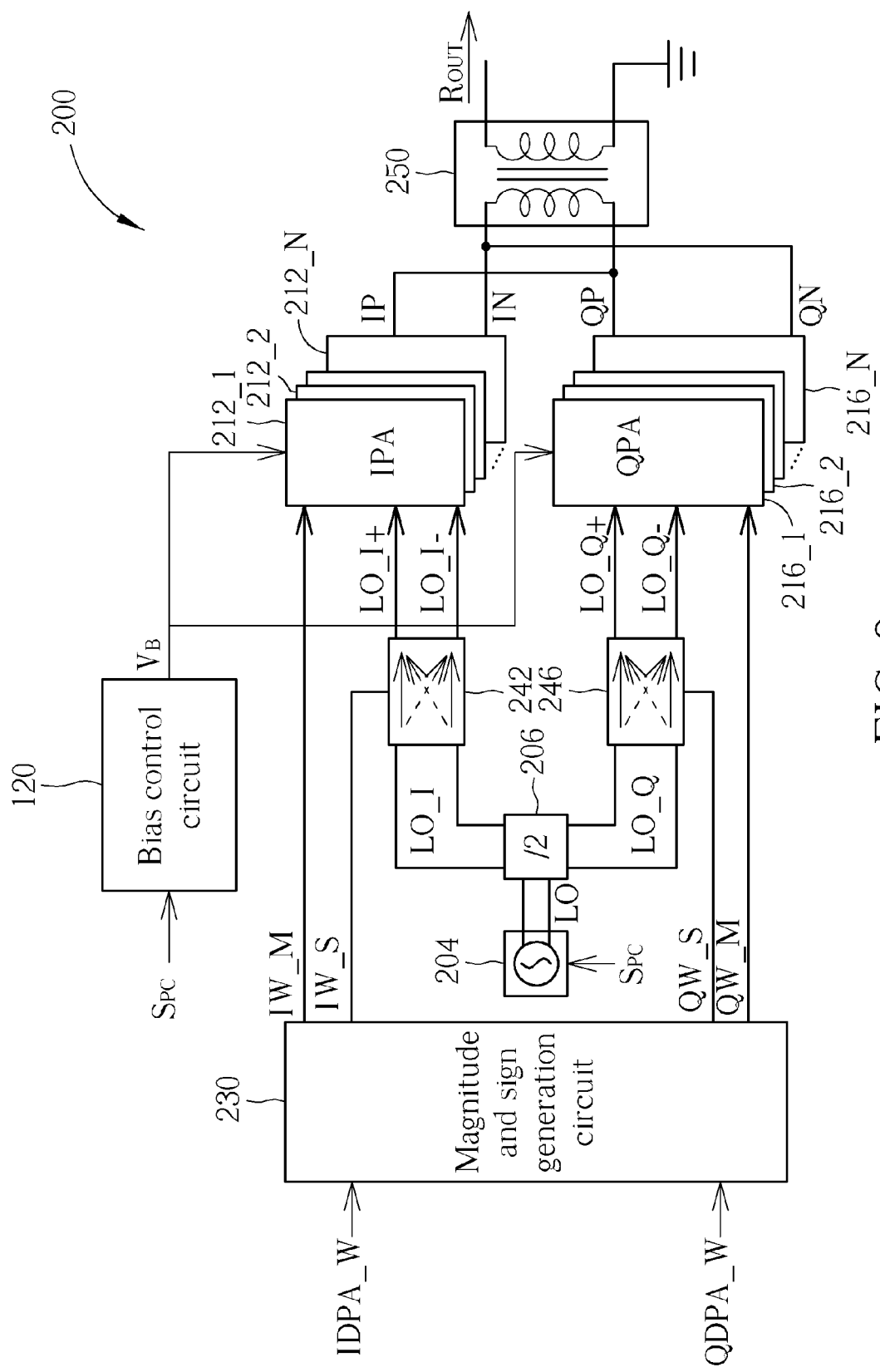
FIG. 2 is a diagram illustrating a circuit architecture of an exemplary radio frequency transmitter according to an embodiment of the present invention.

For better understanding of the present invention, an exemplary implementation of an IQ-based (in-phase and quadrature) DPA is given in the following for further description of the proposed power control mechanism. However, a person skilled in the art should understand that the proposed power control mechanism may be employed in other types of DPAs. Please refer to FIG. 2, which is a diagram illustrating a circuit architecture of an exemplary RF transmitter according to an embodiment of the present invention. As shown in FIG. 2, the RF transmitter 200 may include the bias control circuit 120 shown in FIG. 1, a signal generation circuit 204, a divider circuit 206, a plurality of in-phase power cells 212_1-212_N (labeled IPA), a plurality of quadrature power cells 216_1-216_N (labeled QPA), a magnitude and sign generation circuit 230, a plurality of phase selectors 242 and 246 and a matching network 250. The divider circuit 206, the in-phase power cells 212_1-212_N, the quadrature power cells 216_1-216_N, the magnitude and sign generation circuit 230, the selector 242, the selector 246 and the matching network 250 may be used to implement the DPA 110 shown in FIG. 1, wherein the in-phase power cells 212_1-212_N and the quadrature power cells 216_1-216_N may be regarded as a core circuit of the IQ-based DPA.

In this embodiment, the magnitude and sign generation circuit 230 may generate a magnitude control word IW_M (i.e. a magnitude component of the in-phase control word IDPA_W), a sign signal IW_S (i.e. a sign component of the in-phase control word IDPA_W), a magnitude control word IW_Q (i.e. a magnitude component of the quadrature control word IDPA_Q) and a sign signal IW_Q (i.e. a sign component of the quadrature control word IDPA_Q) according to a digital amplitude control word signal (i.e. an in-phase control word IDPA_W and a quadrature control word QDPA_W). The signal generation circuit 204 may generate an RF input signal (i.e. a carrier frequency signal LO) to the divider circuit 206, and the divider circuit 206 may generate a plurality of carrier frequency signals LO_I and LO_Q according to the carrier frequency signal LO. The phase selector 242 may generate a plurality of carrier frequency signals LO_I+ and LO_I− according to the carrier frequency signal LO_I and the sign signal IW_S, and the phase selector 246 may generate a plurality of carrier frequency signals LO_Q+ and LO_Q− according to the carrier frequency signal LO_Q and the sign signal IW_Q.

The in-phase power cells 212_1-212_N may generate a signal output (i.e. an in-phase component of the RF output signal) according to the bias voltage $V_B$, the magnitude control word IW_M and the carrier frequency signals LO_I+ and LO_I−, wherein each in-phase power cell may be selectively turned on according to a corresponding control bit of the magnitude control word IW_M. In other words, each in-phase power cell may operate as a switching mode power amplifier (PA), and the magnitude control word IW_M may be used to control the number of in-phase power cells which are turned on. Similarly, the quadrature power cells 216_1-216_N may generate another signal output (i.e. a quadrature component of the RF output signal) according to the bias voltage $V_B$, the magnitude control word QW_M and the carrier frequency signals LO_Q+ and LO_Q−, wherein each quadrature power cell may be selectively turned on according to a corresponding control bit of the magnitude control word QW_M. The matching network 250 may be coupled to the in-phase power cells 212_1-212_N through a plurality of connection nodes IP and IN, and may be coupled to the quadrature power cells 216_1-216_N through a plurality of connection nodes QP and QN. Hence, the matching network 250 may generate the RF output signal $R_{OUT}$ according to signal outputs generated from the in-phase power cells 212_1-212_N and the quadrature power cells 216_1-216_N. As a generation mechanism of an in-phase component of the RF output signal $R_{OUT}$ is similar/identical to that of a quadrature component of the RF output signal $R_{OUT}$, only the generation mechanism of the in-phase component (i.e. outputs of the in-phase power cells 212_1-212_N) is described below for brevity.

Figure 3:
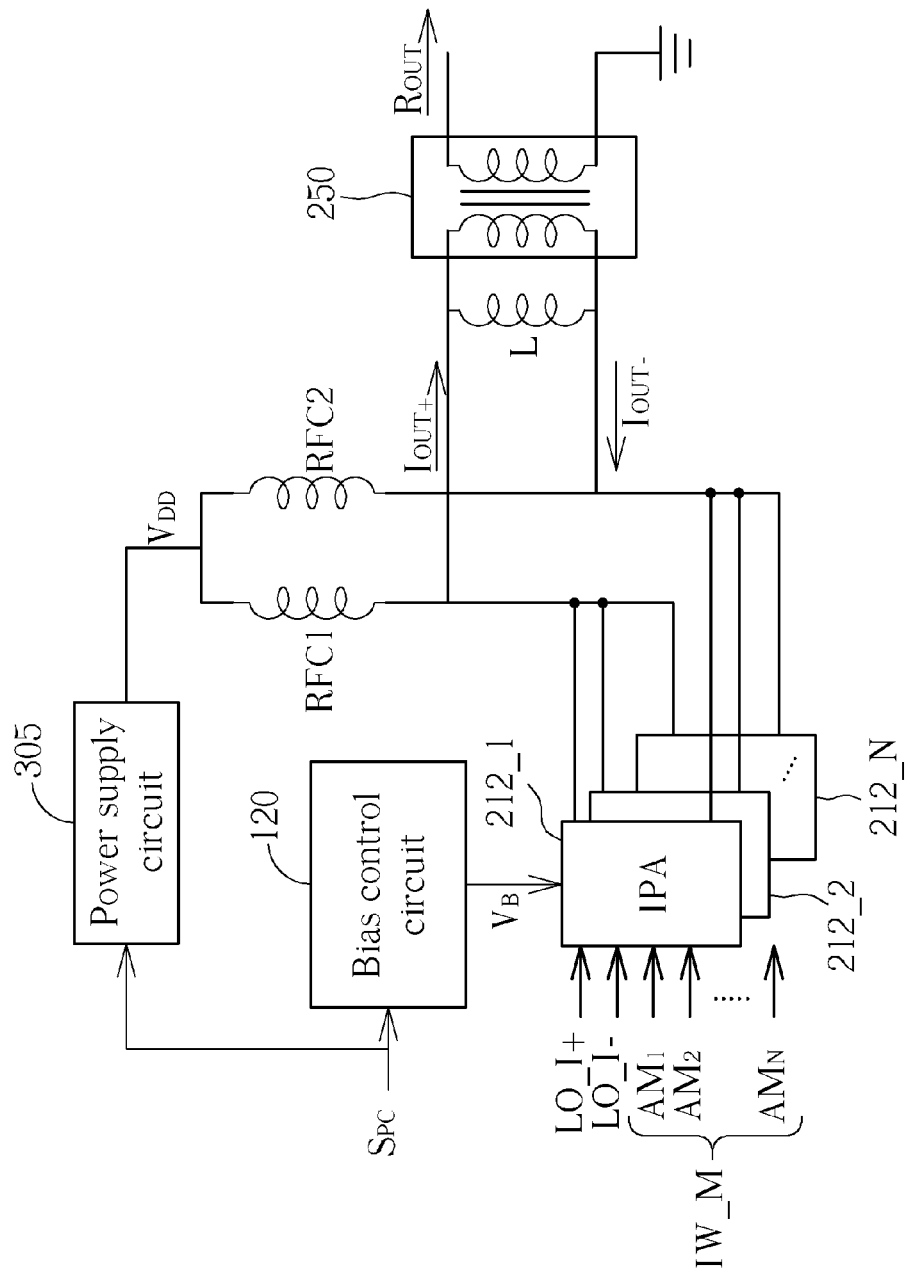
FIG. 3 is an implementation of the generation mechanism of the in-phase component of the radio frequency output signal shown in FIG. 2.

Please refer to FIG. 3 in conjunction with FIG. 2. FIG. 3 is an implementation of the generation mechanism of the in-phase component of the RF output signal $R_{OUT}$ shown in FIG. 2. In this implementation, the RF transmitter 200 may further include a power supply circuit 305 arranged for generating a supply voltage $V_{DD}$, which may be supplied to the in-phase power cells 212_1-212_N through inductors RFC1 and RFC2. The in-phase power cells 212_1-212_N may be selectively turned on according to a plurality of control bits $AM_1$-$AM_N$ of the magnitude control word IW_M, respectively. The turned on in-phase power cell(s) may generate current signals $I_{OUT+}$ and $I_{OUT-}$ (e.g. a differential signal pair) according to the received bias voltage $V_B$ and a plurality of carrier frequency signals LO_I+ and LO_I, wherein the bias voltage $V_B$ may be used to adjust the magnitude of the current signal $I_{OUT+}/I_{OUT-}$ (e.g. a DC component of the current signal $I_{OUT+}/I_{OUT-}$), and an inductor L may be used to improve the signal quality. Next, the matching network 250 may generate the RF output signal $R_{OUT}$ according to the current signals $I_{OUT+}$ and $I_{OUT-}$ (i.e. the current signal $I_{OUT+}/I_{OUT-}$ may be regarded as a current component of the RF output signal $R_{OUT}$). In brief, in addition to controlling the number of turned-on in-phase power cells by using the control bits $AM_1$-$AM_N$, the RF transmitter 200 may control the bias voltage $V_B$ to adjust current signals generated by in-phase power cells in order to adjust the current signals $I_{OUT+}$ and $I_{OUT-}$.

Please note that, in this embodiment, the signal generation circuit 204 may further adjust a duty cycle of the RF input signal (the carrier frequency signal LO shown in FIG. 2) according to the power control signal Spc. Hence, a duty cycle of the carrier frequency signals LO_I+ and LO_I− may be adjusted so as to adjust current signals $I_{OUT+}$ and $I_{OUT-}$. Similarly, a duty cycle of the carrier frequency signals LO_Q+ and LO_Q− shown in FIG. 2 may be adjusted according to the power control signal $S_{PC}$, thus adjusting current signals generated by turned-on quadrature power cells. In addition, the power supply circuit 305 may adjust the supply voltage $V_{DD}$ according to the power control signal Spc, thereby adjusting a DC component of the current signals $I_{OUT+}$ and $I_{OUT-}$. The dynamic output power range of the RF transmitter 200 (or the DPA shown in FIG. 2) may be extended accordingly.

Figure 4:
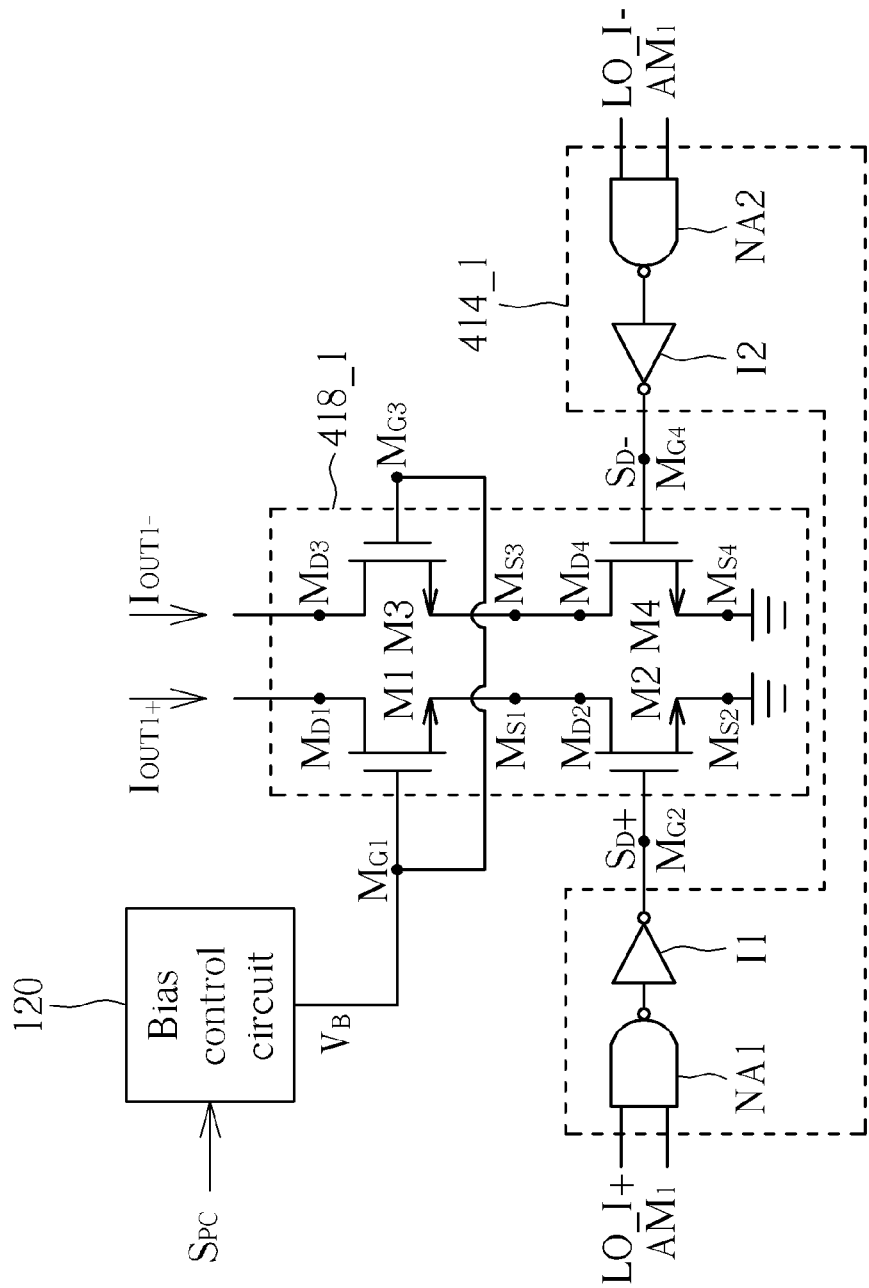
FIG. 4 is an implementation of the in-phase power cell shown in FIG. 3.

In the implementation shown in FIG. 3, circuit architectures of the in-phase power cells 212_1-212_N may be identical or similar to each other. For the sake of brevity, an exemplary implementation of the in-phase power cell 212_1 is given in the following for further description. Please refer to FIG. 4 in conjunction with FIG. 3. FIG. 4 is an implementation of the in-phase power cell 212_1 shown in FIG. 3. In this implementation, the in-phase power cell 212_1 may include a driver stage 414_1 and an output stage 418_1. The driver stage 414_1 may be arranged for receiving an RF input signal (i.e. the carrier frequency signals LO_I+ and LO_I−) and a control bit $AM_1$ to generate a drive signal (i.e. gate drive signals $S_{D+}$ and $S_{D-}$). The output stage 418_1 is coupled to the driver stage 414_1, and may be arranged for receiving the bias voltage $V_B$ and the drive signal and accordingly generating at least a portion of the RF output signal $R_{OUT}$ (i.e. the current signals $I_{OUT+}$ and $I_{OUT-}$). Please note that, as the bias voltage $V_B$ may be supplied to an output stage (or an amplification stage) of an in-phase power cell, a voltage variation of the bias voltage $V_B$ may adjust an output signal of the in-phase power cell rather than impact the output power range thereof.

In practice, the in-phase power cell 212_1 shown in FIG. 3 may employ an architecture of a class-D PA (e.g. an architecture of a switching mode PA shown in FIG. 4) to boost power efficiency. Additionally, the output stage 418_1 may include at least one MOS transistor, and the bias voltage $V_B$ may be supplied to a gate of the at least one MOS transistor in order to adjust an output signal. For example, the driver stage 414_1 may include a plurality of NAND gates NA1 and NA2 and a plurality of inverters I1 and I2. The carrier frequency signal LO_I+ and the control bit $AM_1$ are inputted to the NAND gate NA1, an output of the NAND gate NA1 is inputted to the inverter I1, and the gate drive signal $S_{D+}$ is outputted from the inverter I1. Hence, when the control bit $AM_1$ has a specific logical value (e.g. a logical value 1) as to turn on the in-phase power cell 212_1, the carrier frequency signal LO_I+ may be outputted from the inverter I1 and used as the gate drive signal $S_{D+}$. Similarly, the carrier frequency signal LO_I− and the control bit $AM_1$ are inputted to the NAND gate NA2, an output of the NAND gate NA2 is inputted to the inverter I2, and the gate drive signal $S_{D-}$ is outputted from the inverter I2. When the control bit $AM_1$ has a specific logical value (e.g. a logical value 1), the carrier frequency signal LO_I− may be outputted from the inverter I2 and used as the gate drive signal $S_{D-}$.

The output stage 418_1 may include a plurality of MOS transistors M1-M4. A gate $M_{G1}$ of the MOS transistor M1 and a gate $M_{G3}$ of the MOS transistor M3 are coupled to the bias voltage $V_B$; a drain $M_{D1}$ of the MOS transistor M1 and a drain $M_{D3}$ of the MOS transistor M3 may be used to receive the current signal $I_{OUT1+}$, and the current signal $I_{OUT1-}$, respectively; a source $M_{S1}$ of the MOS transistor M1 and a source $M_{S3}$ of the MOS transistor M3 may be coupled to a drain $M_{D2}$ of the MOS transistor M2 and a drain $M_{D4}$ of the MOS transistor M4, respectively; a gate $M_{G2}$ of the MOS transistor M2 and a gate $M_{G4}$ of the MOS transistor M4 may be used to receive the gate drive signal $S_{D+}$ and the gate drive signal $S_{D-}$, respectively; and a source $M_{S2}$ of the MOS transistor M2 and a source $M_{S4}$ of the MOS transistor M4 may be coupled to ground. As shown in FIG. 4, the current signals $I_{OUT1+}$ and $I_{OUT1-}$ may be varied in response to a gate bias of cascade transistors of the output stage 418_1. For example, in a case where the in-phase power cell 212_1 is turned on according to the control bit $AM_1$, when the bias control circuit 120 adjusts/controls the bias voltage $V_B$ according to the power control signal $S_{PC}$, a DC component of the current signal $I_{OUT1+}/I_{OUT1-}$ may be varied accordingly. Hence, the output power of the RF output signal $R_{OUT}$ may be adjusted.

Figure 5:
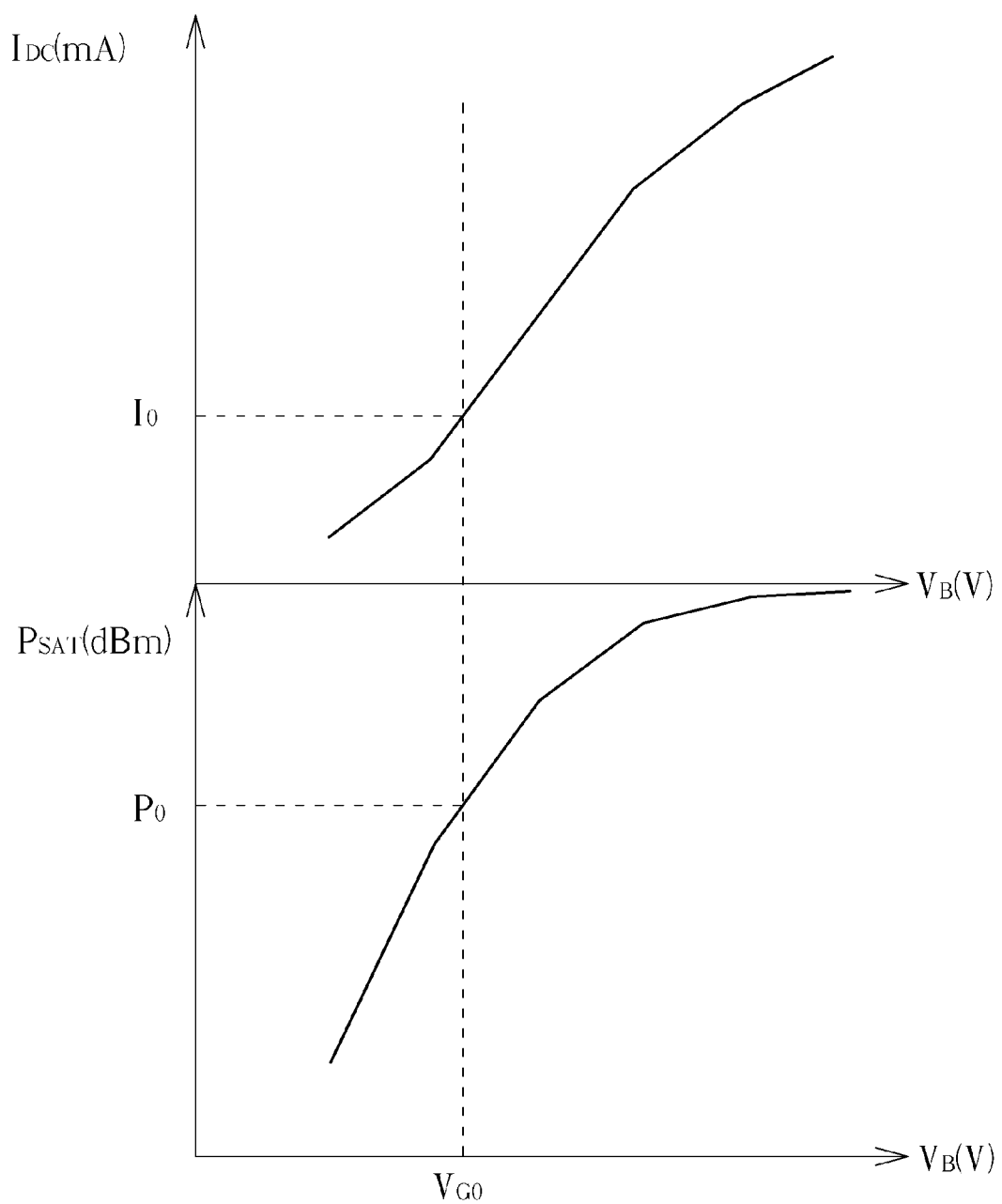
FIG. 5 is a diagram illustrating saturation powers and direct current components of the current signal under different bias voltage levels of the radio frequency transmitter shown in FIG. 2.
Figure 6:
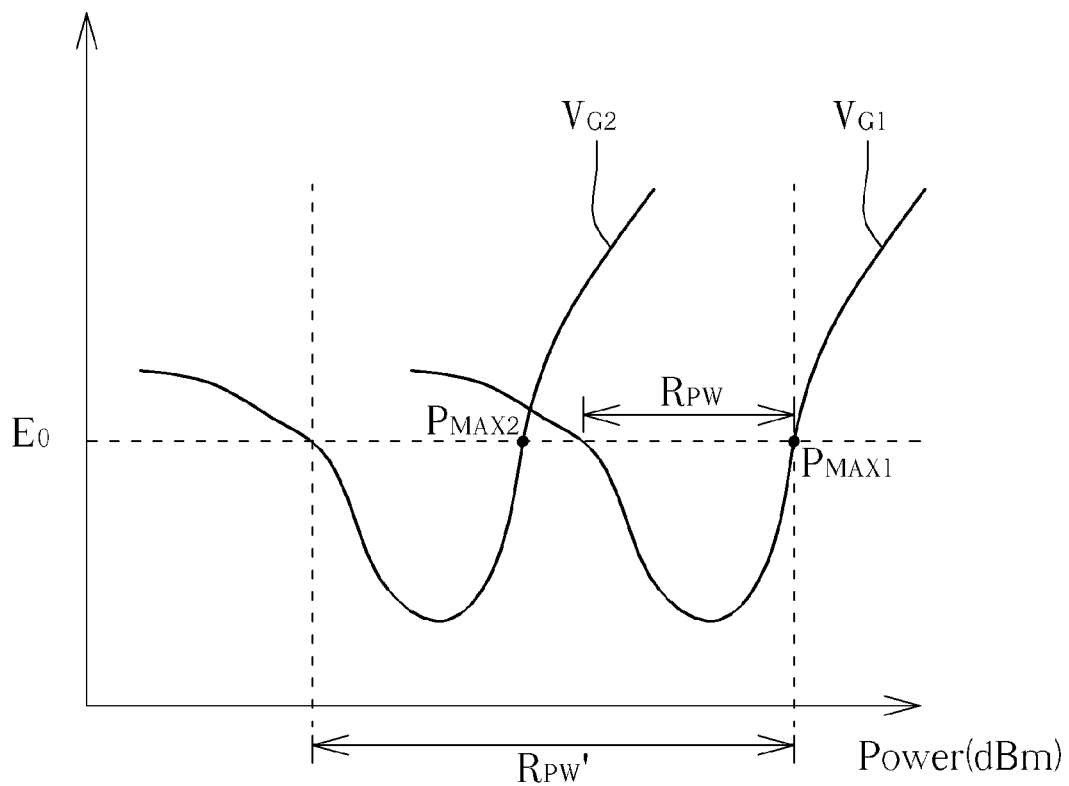
FIG. 6 is a diagram illustrating a relationship between an error vector magnitude and an output power under different bias voltage levels of the radio frequency transmitter 200 shown in FIG. 2.

Please refer to FIG. 5 and FIG. 6 in conjunction with FIG. 2. FIG. 5 is a diagram illustrating saturation powers and DC components of the current signal $I_{OUT+}/I_{OUT-}$ under different bias voltage levels of the RF transmitter 200 shown in FIG. 2. FIG. 6 is a diagram illustrating a relationship between an error vector magnitude (EVM) and an output power (i.e. the output power of the RF output signal) under different bias voltage levels of the RF transmitter 200 shown in FIG. 2. As shown in FIG. 5, in a case where the in-phase control word IDPA_W and quadrature control word QDPA_W are fixed, the bias control circuit 120 may adjust a voltage level of the bias voltage $V_B$ (e.g. a gate bias of the MOS transistor M1/M3 shown in FIG. 4) to according to the power control signal $S_{PC}$, thereby varying the DC component $I_{DC}$ of the current signal $I_{OUT+}/I_{OUT-}$ and adjusting a power level of the saturation power $P_{SAT}$. As shown in FIG. 6, when a voltage level of the bias voltage $V_B$ generated by the bias control circuit 120 equals to a voltage level $V_{G1}$, a maximum output power (corresponding to an EVM target level $E_0$) of the RF transmitter 200 equals a power $P_{MAX1}$; when a voltage level of the bias voltage $V_B$ generated by the bias control circuit 120 equals to a voltage level $V_{G2}$, a maximum output power (corresponding to an EVM target level $E_0$) of the RF transmitter 200 equals a power $P_{MAX2}$.

Specifically, when the RF transmitter 200 operates at a specific bias voltage level (e.g. the voltage level $V_{G1}$) and the signal generation circuit 204 generates the carrier frequency signal LO having a specific duty cycle, the output power of the RF transmitter 200 is controlled substantially by digital power control (i.e. adjusting the digital amplitude control word signal), and the dynamic output power range of the RF transmitter 200 equals an output power range $R_{PW}$, which may be narrow due to a digital power back-off. When the bias control voltage 120 may control the bias voltage $V_B$ according to the power control signal $S_{PC}$ (e.g. decreasing the gate bias of the MOS transistor M1/M3 from the voltage level $V_{G1}$ to voltage level $V_{G2}$), the RF transmitter 200 may have a wider dynamic output power range (e.g. extended from the output power range $R_{PW}$ to an output power range $R_{PW}'$). In other words, the output power of the DPA shown in FIG. 2 may be adjusted by at least one of the bias voltage $V_B$ and the digital amplitude control word signal, thus increasing the power control range of the DPA shown in FIG. 2 and equivalently extending the dynamic output power range of the RF transmitter 200 (or the IQ-based DPA). The dynamic output power range of the RF transmitter 200 (or the IQ-based DPA) may be regarded as a union of output power ranges under different voltage levels of the bias voltage $V_B$.

It should be noted that, besides using bias voltage to control the power level of the saturation power $P_{SAT}$, the RF transmitter 200 may adjust the duty cycle of the carrier frequency signal LO or adjust the supply voltage $V_{DD}$ shown in FIG. 3 to control the saturation power $P_{SAT}$, thus extending the power control range and the dynamic output power range much further.

Please note that the above is for illustrative purposes only, and is not meant to be a limitation of the present invention. In one implementation, the bias control circuit 120 shown in FIG. 1 may generate a plurality of bias voltages to the DPA 110 according to the power control signal $S_{PC}$. For example, the bias control circuit 120 shown in FIG. 2 may generate a plurality of bias voltages to the in-phase power cells 212_1-212_N and/or the quadrature power cells 216_1-216_N. Hence, each in-phase power cell (or each quadrature power cell) may adjust a corresponding output signal (e.g. a current signal) according to a corresponding bias voltage. In another implementation, the circuit architectures of the in-phase power cells 212_1-212_N shown in FIG. 2 may be different, and/or the circuit architectures of the quadrature power cells 216_1-216_N shown in FIG. 2 may be different. In yet another implementation, the driver stage 414_1 and/or the output stage 418_1 may be implemented by other circuit topologies. In still another implementation, each in-phase power cell and/or each quadrature power cell shown in FIG. 2 may be implemented by other types of amplifier circuits (e.g. a class-E amplifier or an inverse class-F amplifier).

Figure 7:
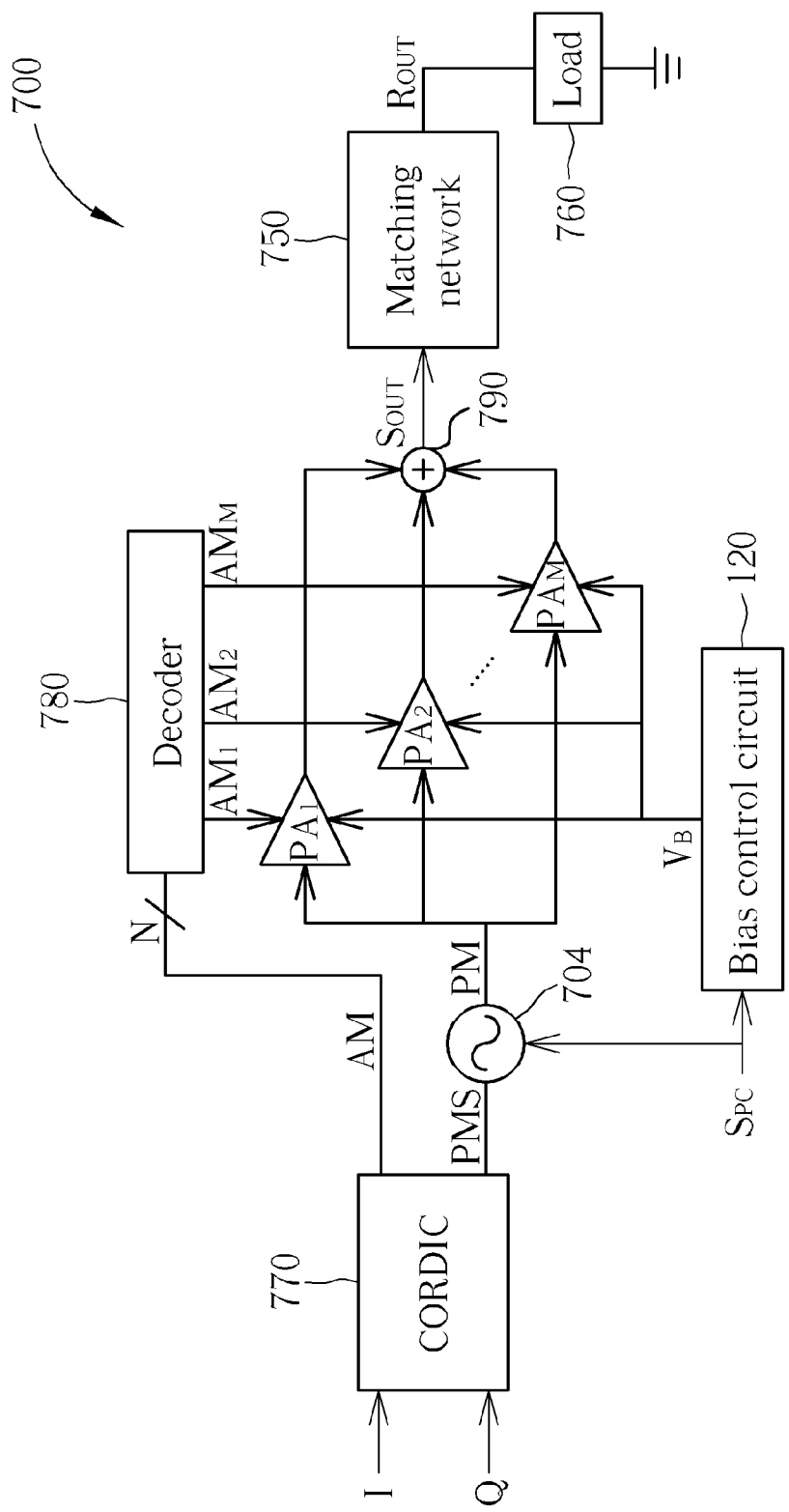
FIG. 7 is a diagram illustrating a circuit architecture of an exemplary radio frequency transmitter according to another embodiment of the present invention.

The proposed power control mechanism may be employed in a polar-based DPA. Please refer to FIG. 7, which is a diagram illustrating a circuit architecture of an exemplary RF transmitter according to another embodiment of the present invention. As shown in FIG. 7, the RF transmitter 700 may include the bias control circuit 120 shown in FIG. 1, a signal generation circuit 704, a plurality of power cells $PA_1$-$PA_M$, a matching network 750, a coordinate rotation digital computer (CORDIC) 770, a decoder 780 and a summing circuit 790, wherein the power cells $PA_1$-$PA_M$, the decoder 780 and the summing circuit 790 may be used to implement a core circuit of a polar-based DPA. The CORDIC 770 may generate a digital amplitude modulated signal AM (having N control bits) and a digital phase modulated signal PMS according to an in-phase input signal I and a quadrature input signal Q. The decoder 780 may generate M control signals $AM_1$-$AM_M$ according to the digital amplitude modulated signal AM, wherein $M=2^N-1$, and each power cell may be selectively turned on according to a corresponding control signal. The signal generation circuit 704 may generate a carrier frequency signal PM (i.e. a phase modulated signal) to each power cell. Next, each turned-on power cell may generate a corresponding output signal according to the carrier frequency signal PM and the bias voltage $V_B$, and the summing circuit 790 may generate a summed output signal $S_{OUT}$ according to output signals from the turned-on power cells. The matching network 750 may generate an RF output signal to a load 760 according to the summed output signal $S_{OUT}$.

In one implementation, the bias control circuit 120 may generate a plurality of bias voltages to the power cells $PA_1$-$PA_M$ according to the power control signal $S_{PC}$. Hence, each power cell may adjust an output signal thereof according to a corresponding bias voltage. As a person skilled in the art of a polar-based DPA should understand the operations of extending a dynamic output power range of the RF transmitter 700, further description is omitted here for brevity.

Figure 8:
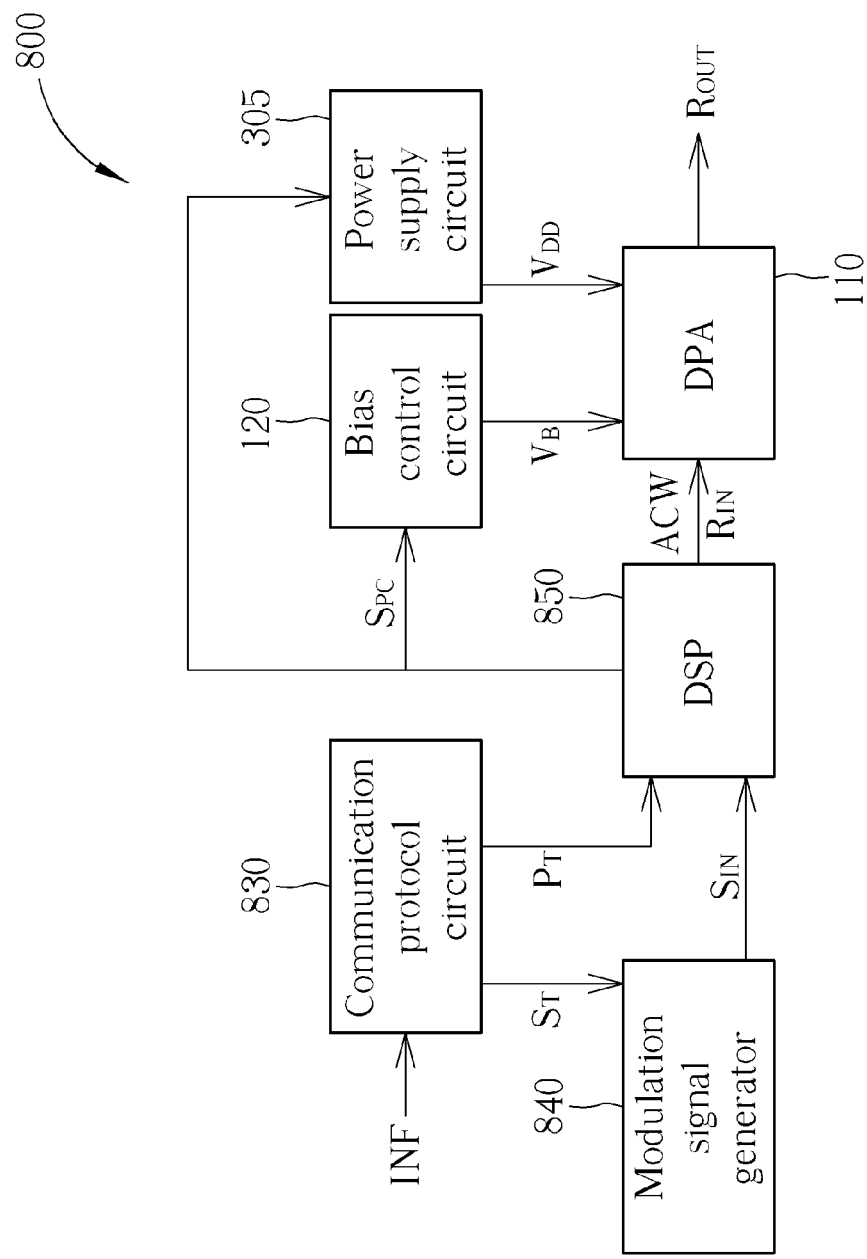
FIG. 8 is a block diagram illustrating an exemplary radio frequency transmitter according to another embodiment of the present invention.

Please refer to FIG. 8, which is a block diagram illustrating an exemplary RF transmitter according to another embodiment of the present invention. In this embodiment, the RF transmitter 800 may be informed of whether to adjust an output power thereof via a communication protocol, thus improving system performance thereof. The RF transmitter 800 may include the DPA 110 and the bias control circuit 120 shown in FIG. 1, a communication protocol circuit 830, a modulation signal generator 840 and a digital signal processing circuit (DSP) 850. The communication protocol circuit 830 may provide a target power information $P_T$ and a modulation control signal $S_T$ (e.g. carrying information of modulation types) according to external information INF from a communication network (not shown in FIG. 8). The modulation signal generator 840 is coupled to the communication protocol circuit 830, and may be used to generate a modulation signal $S_{IN}$ according to the modulation control signal $S_T$. The DSP 850 is coupled to the modulation signal generator 840, the communication protocol circuit 830, the DPA 110 and the bias control circuit 120, and may be arranged for receiving the target power information $P_T$ and the modulation signal $S_{IN}$. The DSP 850 may further generate the power control signal $S_{PC}$ (e.g. a command signal or a digital baseband signal) according to the target power information $P_T$, generate the digital amplitude control word signal ACW, and generate the RF input signal $R_{IN}$ according to modulation signal $S_{IN}$. Specifically, the RF input signal $R_{IN}$ may be generated in response to different communication standards. Next, the DPA 110 may generate the RF output signal $R_{OUT}$ according to a bias voltage $V_B$ generated by the bias control circuit 120, the RF input signal $R_{IN}$ and the digital amplitude control word signal ACW.

For example, when the external information INF indicates that an output power of the RF transmitter 800 is so high as to cause transmission interference, the communication protocol circuit 830 may generate the target power information $P_T$ which indicates a target power updated in response to the external information INF. The DSP 850 may generate the power control signal Spc according to the target power information $P_T$, and adjust an output power level of the RF output signal $R_{OUT}$ to a power level of the target power by controlling the bias voltage $V_B$. Additionally, the DSP 850 may generate the digital amplitude control word signal ACW according to the target power information $P_T$, and adjust the output power level of the RF output signal $R_{OUT}$ to the power level of the target power by controlling the number of turned-on power cells of the DPA 110 (e.g. the in-phase/quadrature power cells shown in FIG. 2). In other words, the DSP 850 may control the bias voltage $V_B$ and the digital amplitude control word signal ACW according to the target power information $P_T$ in order to adjust the output power of the RF output signal $R_{OUT}$. In an alternative design, the DSP 850 may further adjust the duty cycle of the RF input signal $R_{IN}$ according to the power control signal Spc (e.g. the signal generation circuit 204/704 may be implemented in the DSP 850). In another alternative design, the RF transmitter 800 may further include the power supply circuit 305 shown in FIG. 3, and the power supply circuit 305 may adjust the supply voltage $V_{DD}$ supplied to the DPA 110 according to the power control signal Spc in order to adjust the output power level of the RF output signal $R_{OUT}$. Please note that, the DSP 850 may merely control the bias voltage $V_B$ according to the power control signal Spc (i.e. each of the digital amplitude control word signal ACW, the duty cycle of the RF input signal $R_{IN}$ and the supply voltage $V_{DD}$ is not adjusted) in order to adjust the output power of the RF output signal $R_{OUT}$.

Figure 9:
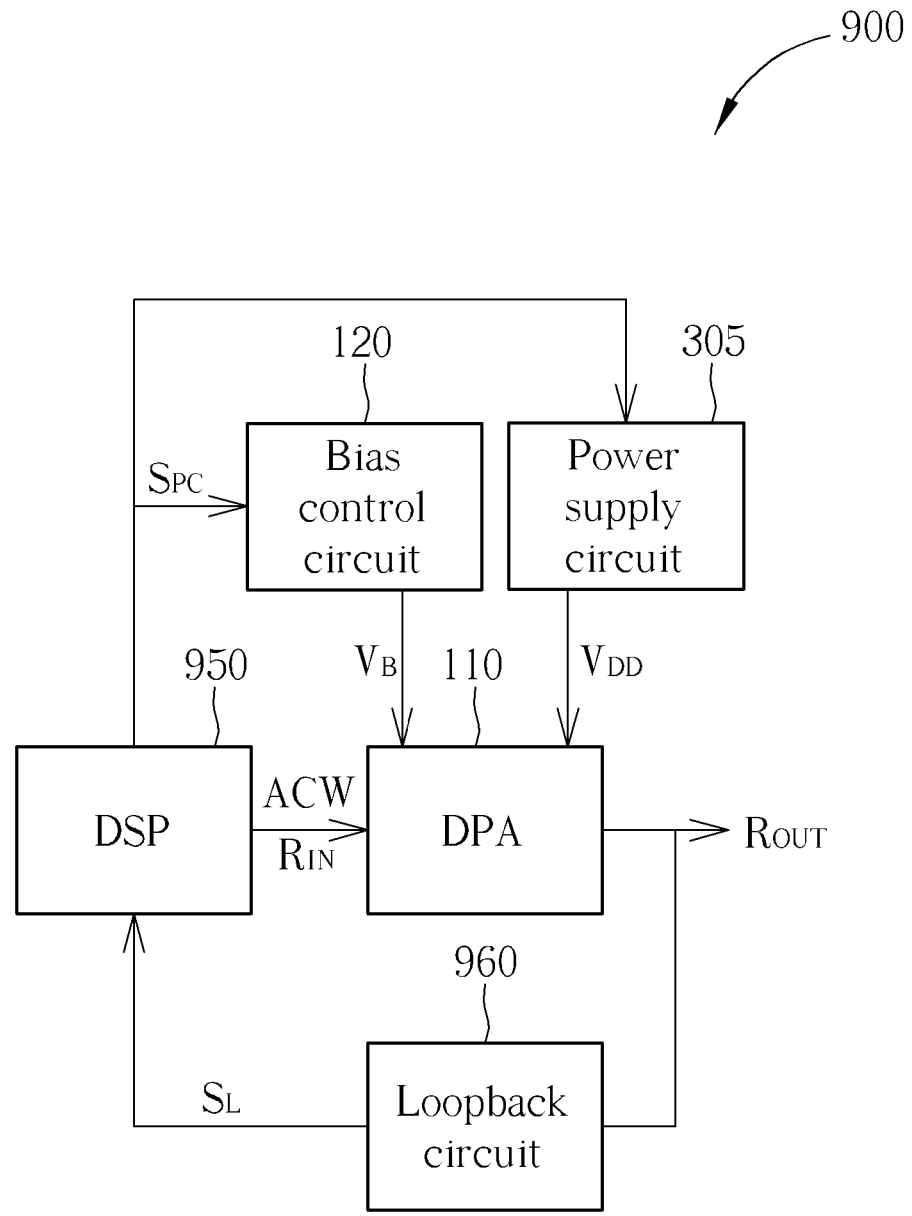
FIG. 9 is a block diagram illustrating an exemplary radio frequency transmitter according to another embodiment of the present invention.

The proposed bias control concept may be employed to tune (or calibrate) a saturation power, thus reducing/eliminating effects of process variations on transmission performance. Please refer to FIG. 9, which is a block diagram illustrating an exemplary RF transmitter according to another embodiment of the present invention. As shown in FIG. 9, the RF transmitter 900 may include the DPA 110 and the bias control circuit 120 shown in FIG. 1, a digital signal processing circuit (DSP) 950 and a loopback circuit 960. The DSP 950 is coupled to the loopback circuit 960, the DPA 110 and the bias control circuit 120, and may be arranged for generating an RF input signal $R_{IN}$ and a digital amplitude control word signal ACW to the DPA 110. The DSP 950 may further generate the power control signal $S_{PC}$ to the bias control circuit 120 according to a loopback signal $S_L$. The loopback circuit 960 is coupled to the DPA 110, and may be arranged for receiving the RF output signal $R_{OUT}$ generated by the DPA 110 to generate the loopback signal $S_L$.

In a case where the RF transmitter 900 operates to tune a saturation power of the RF output signal $R_{OUT}$, the DPA 110 may operates under a predetermined digital power control, wherein the predetermined digital power control corresponds to a control setting of a predetermined saturation power. For example, the DPA 110 may employ a circuit architecture including a plurality of power cells shown in FIG. 2, wherein each power cell may be selectively turned on according to a corresponding control bit of the digital amplitude control word signal ACW generated from the DSP 950. Additionally, the digital amplitude control word signal ACW may have a specific bit pattern to turn on a specific number of power cells (e.g. each control bit shown in FIG. 2 has a specific logical value in order to turn on the in-phase power cells 212_1-212_N), and the specific bit pattern may be regarded as the predetermined digital power control. In other words, the DSP 950 may generate the digital amplitude control word signal ACW without referring to the loopback signal $S_L$.

Next, the loopback circuit 960 may generate the loopback signal $S_L$ to the DSP 950 according to the RF output signal $R_{OUT}$, wherein the loopback signal $S_L$ may carry information of the output power of the RF output signal $R_{OUT}$. Hence, the DSP 950 may determine if an output power level of the RF output signal $R_{OUT}$ equals a saturation power level of the predetermined saturation power according to loopback signal $S_L$. In one implementation, when it is determined that the output power level is smaller than the saturation power level, the DSP 950 may control the power control signal $S_{PC}$ to adjust (e.g. increase) the bias voltage $V_B$ until the output power level substantially equals the saturation power level. To put it differently, during saturation power tuning/calibration, the digital amplitude control word signal ACW may have a fixed bit pattern while the DSP 950 is generating the power control signal $S_{PC}$ according to the loopback signal $S_L$.

In an alternative design, the DSP 950 may further adjust the duty cycle of the RF input signal $R_{IN}$ according to the power control signal Spc (e.g. the signal generation circuit 204/704 may be implemented in the DSP 950) during saturation power tuning/calibration. In another alternative design, the RF transmitter 900 may further include the power supply circuit 305 shown in FIG. 3, and the power supply circuit 305 may adjust the supply voltage $V_{DD}$ supplied to the DPA 110 according to the power control signal Spc during saturation power tuning/calibration.

Please note that the above is for illustrative purposes only, and is not meant to be a limitation of the present invention. For example, as long as the digital amplitude control word signal ACW may turn on the specific number of power cells, the bit pattern of the digital amplitude control word signal ACW may not be fixed. Additionally, the power tuning mechanism of the RF transmitter 900 is not limited to saturation power tuning. In one implementation, the power tuning mechanism may be used to tune other target powers (i.e. the aforementioned predetermined digital power control may be adjusted accordingly). Further, the power tuning mechanism may be employed in other types of amplifier architectures (e.g. the amplifier architecture shown in FIG. 7).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A radio frequency (RF) transmitter, comprising:
   a digital signal processing circuit, arranged for generating a digital amplitude control word signal and a power control signal, wherein the power control signal is a digital command;
   a bias control circuit, coupled to the digital signal processing circuit, the bias control circuit arranged for receiving the power control signal, adjusting at least one bias voltage according to the power control signal, and outputting the at least one adjusted bias voltage;
   a digital power amplifier (DPA), coupled to the digital signal processing circuit and the bias control circuit, the DPA arranged for receiving at least an RF input signal, the digital amplitude control word signal and the at least one adjusted bias voltage to generate an RF output signal; and
   a loopback circuit, coupled to the digital signal processing circuit and the DPA, the loopback circuit arranged for receiving the RF output signal to generate a loopback signal, wherein the digital signal processing circuit generates the power control signal according to the loopback signal.

2. The RF transmitter of claim 1, wherein a current component of the RF output signal is adjusted in response to the at least one bias voltage.

3. The RF transmitter of claim 1, wherein the DPA comprises at least one metal-oxide-semiconductor (MOS) transistor, and the at least one bias voltage is supplied to a gate of the at least one MOS transistor.

4. The RF transmitter of claim 1, wherein the DPA comprises a plurality of power cells, and at least one of the power cells comprises:

a driver stage, for receiving the RF input signal and a control bit of the digital control amplitude control word signal to generate a drive signal, wherein the power cell is selectively turned on according to the control bit of the digital control amplitude control word signal; and an output stage, coupled to the driver stage, the output stage arranged for receiving the at least one bias voltage and the drive signal and accordingly generating at least a portion of the RF output signal.

5. The RF transmitter of claim 4, wherein the output stage comprises at least one metal-oxide-semiconductor (MOS) transistor, and the at least one bias voltage is supplied to a gate of the at least one MOS transistor.

6. The RF transmitter of claim 1, further comprising:

a communication protocol circuit, coupled to the digital signal processing circuit, the communication protocol circuit arranged for receiving external information from a communication network to provide target power information;

wherein the digital signal processing circuit is arranged for receiving the target power information and generating the power control signal according to the target power information.

7. The RF transmitter of claim 6, wherein the digital signal processing circuit is further arranged for generating the digital amplitude control word signal according to the target power information.

8. The RF transmitter of claim 1, wherein the digital signal processing circuit is further arranged for generating the digital amplitude control word signal without referring to the loopback signal.

9. The RF transmitter of claim 1, wherein the DPA comprises a plurality of power cells; each power cell is turned on according to a control bit of the digital control amplitude control word signal; and the digital amplitude control word signal has a fixed bit pattern while the digital signal processing circuit is generating the power control signal according to the loopback signal.

10. The RF transmitter of claim 1, wherein a power level of the RF output signal is adjusted to a saturation power level.

11. The RF transmitter of claim 1, further comprising:

a signal generation circuit, coupled to the DPA, the signal generation circuit arranged for adjusting a duty cycle of the RF input signal according to the power control signal.

12. The RF transmitter of claim 1, wherein the DPA further receives a supply voltage, and generates the RF output signal according to the RF input signal, the digital amplitude control word signal, the at least one bias voltage and the supply voltage; and the RF transmitter further comprises:

a voltage supply circuit, coupled to the DPA, the voltage supply circuit arranged for adjusting a supply voltage supplied to the DPA according to the power control signal.

13. A radio frequency (RF) transmission method, comprising:

utilizing a digital signal processing circuit to generate a digital amplitude control word signal and a power control signal, wherein the power control signal is a digital command;

receiving the power control signal, adjusting at least one bias voltage according to the power control signal, and outputting the at least one adjusted bias voltage;

utilizing a digital power amplifier (DPA) to receive the at least one adjusted bias voltage, and generate an RF output signal according to at least an RF input signal, the digital amplitude control word signal and the at least one adjusted bias voltage; and receiving the RF output signal to generate a loopback signal;

wherein the step of utilizing the digital signal processing circuit to generate the digital amplitude control word signal and the power control signal comprises:

generating the power control signal according to the loopback signal by performing a digital signal processing operation.

14. The RF transmission method of claim 13, wherein a current component of the RF output signal is adjusted in response to the at least one bias voltage.

15. The RF transmission method of claim 13, wherein the DPA comprises at least one metal-oxide-semiconductor (MOS) transistor, and the at least one bias voltage is supplied to a gate of the at least one MOS transistor.

16. The RF transmission method of claim 13, wherein the DPA comprises a plurality of power cells, at least one of the power cells comprises a driver stage and an output stage coupled to the driver stage, and the step of utilizing the DPA to generate the RF output signal according to the RF input signal, the digital amplitude control word signal and the at least one bias voltage comprises:

utilizing the driver stage to receive the RF input signal and a control bit of the digital control amplitude control word signal to generate a drive signal, wherein the power cell is selectively turned on according to the control bit of the digital control amplitude control word signal; and utilizing the output stage to receive the at least one bias voltage and the drive signal and accordingly generate at least a portion of the RF output signal.

17. The RF transmission method of claim 16, wherein the output stage comprises at least one metal-oxide-semiconductor (MOS) transistor, and the at least one bias voltage is supplied to a gate of the at least one MOS transistor.

18. The RF transmission method of claim 13, further comprising:

receiving external information from a communication network to provide target power information;

wherein the step of utilizing the digital signal processing circuit to generate the digital amplitude control word signal and the power control signal comprises:

generating the power control signal according to the target power information by performing a digital signal processing operation.

19. The RF transmission method of claim 18, wherein the step of utilizing the digital signal processing circuit to generate the digital amplitude control word signal and the power control signal further comprises:

generating the digital amplitude control word signal according to the target power information by performing another digital signal processing operation.

20. The RF transmission method of claim 13, wherein the step of utilizing the digital signal processing circuit to generate the digital amplitude control word signal and the power control signal further comprises:

performing another digital signal processing operation to generate the digital amplitude control word signal without referring to the loopback signal.

21. The RF transmission method of claim 13, wherein the DPA comprises a plurality of power cells; each power cell is turned on according to a control bit of the digital control amplitude control word signal; and the digital amplitude control word signal has a fixed bit pattern while the step of generating the power control signal according to the loop-back signal by performing the digital signal processing operation is performed.

22. The RF transmission method of claim 13, wherein a power level of the RF output signal is adjusted to a saturation power level.

23. The RF transmission method of claim 13, further comprising:
   adjusting a duty cycle of the RF input signal according to the power control signal.

24. The RF transmission method of claim 13, further comprising:
   adjusting a supply voltage supplied to the DPA according to the power control signal;
   and the step of utilizing the DPA to generate the RF output signal according to at least the RF input signal, the digital amplitude control word signal and the at least one bias voltage comprises:
   utilizing the DPA to generate the RF output signal according to the RF input signal, the digital amplitude control word signal, the at least one bias voltage and the supply voltage.

* * * * *